(12) United States Patent
Calderoni et al.

(10) Patent No.: US 7,115,210 B2
(45) Date of Patent: Oct. 3, 2006

(54) MEASUREMENT TO DETERMINE PLASMA LEAKAGE

(75) Inventors: Robert A. Calderoni, Fairfield, VT (US); June Cline, South Burlington, VT (US); Kellie L. Dutra, Essex Junction, VT (US); Ronald G. Meunier, Essex Junction, VT (US); Joseph P. Walko, Jericho, VT (US); Justin Wai-chow Wong, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 132 days.

(21) Appl. No.: 10/708,009

(22) Filed: Feb. 2, 2004

(65) Prior Publication Data

US 2005/0167396 A1    Aug. 4, 2005

(51) Int. Cl.
*H01I 21/302* (2006.01)
(52) U.S. Cl. .................. 216/59; 216/61; 118/712; 275/E21.528; 438/14; 438/16; 455/118
(58) Field of Classification Search .................. 216/59
See application file for complete search history.

(56) References Cited

U.S. PATENT DOCUMENTS

| | | | |
|---|---|---|---|
| 5,326,975 A | | 7/1994 | Barna |
| 5,467,013 A | | 11/1995 | Williams et al. |
| 5,576,629 A | | 11/1996 | Turner et al. |
| 5,810,963 A | | 9/1998 | Tomioka |
| 5,925,212 A | * | 7/1999 | Rice et al. ............. 156/345.27 |
| 5,971,591 A | | 10/1999 | Vonna et al. |
| 6,228,278 B1 | * | 5/2001 | Winniczek et al. ........... 216/61 |
| 6,599,759 B1 | | 7/2003 | Yang et al. |
| 6,661,250 B1 | * | 12/2003 | Kim et al. .................... 326/30 |
| 6,756,790 B1 | * | 6/2004 | Yakabe et al. .............. 324/649 |
| 2002/0039887 A1 | * | 4/2002 | Delabbaye et al. ........... 455/42 |
| 2002/0171454 A1 | * | 11/2002 | Yakabe et al. ................ 327/77 |
| 2003/0085662 A1 | | 5/2003 | Kwon et al. |
| 2003/0121609 A1 | * | 7/2003 | Ohmi et al. ........... 156/345.47 |
| 2003/0227283 A1 | * | 12/2003 | Cox et al. .................. 324/71.1 |
| 2004/0055868 A1 | * | 3/2004 | O'Leary et al. ....... 204/157.15 |
| 2004/0116080 A1 | * | 6/2004 | Chen et al. .............. 455/115.1 |
| 2004/0129218 A1 | * | 7/2004 | Takahashi et al. .......... 118/715 |
| 2004/0135590 A1 | * | 7/2004 | Quon ......................... 324/713 |
| 2004/0149384 A1 | * | 8/2004 | Kanno et al. .......... 156/345.24 |
| 2005/0145334 A1 | * | 7/2005 | Parsons ................. 156/345.24 |

FOREIGN PATENT DOCUMENTS

JP        2003173973      *    6/2003

OTHER PUBLICATIONS

Hanson et al. of Advanced Energy: Optimization Chemical Vapor Deposition Processing through RF Metrology, 1999.*

(Continued)

*Primary Examiner*—Nadine Norton
*Assistant Examiner*—Patricia George
(74) *Attorney, Agent, or Firm*—Gibb I.P. Law Firm, LLC; Anthony Canale (57) ABSTRACT

Disclosed is a method and system for detecting abnormal plasma discharge that is useful in, for example, detecting plasma leakage in a reactive ion etching (RIE) chamber. The system includes electrical contacts connected to the chamber that provide an input signal to the chamber. This input signal can be generated by a radio frequency (RF) generator that is connected to the electrical contacts. A variable power controller connected to the RF generator gradually increases (ramps) the power of the input signal being supplied to the chamber.

14 Claims, 4 Drawing Sheets

OTHER PUBLICATIONS

Angra et al., Pramana_Journal of Physics, vol. 54, No. 5, May 2000, pp. 763-769: Unstable Plasma Charicteristics in Mirror Field Electron Cyclotron Resonance, Microwave Ion Source.*

Plasma diagnostics in industry; M B Hopkins and J F Iawler; Plasma Phy. Control Fussion 42; 2000; B189-B197; Printed in the UK.*

* cited by examiner

MEASUREMENT TO DETERMINE PLASMA LEAKAGE

BACKGROUND OF INVENTION

1. Field of the Invention

The present invention relates to a method and system for detecting abnormal plasma discharge that is useful in, for example, detecting plasma leakage in a reactive ion etching (RIE) chamber.

2. Description of the Related Art

When performing processing in a chamber, such as reactive ion etching (RIE) within a plasma chamber, various problems can occur that affect the quality of the processing performed in the chamber. One problem that can occur is plasma leakage. More specifically, plasma leakage occurs when secondary plasma is formed in locations of the reactor other than the desired region. The source of the plasma leakage can be attributed to a variety of factors, some of which are difficult to monitor (e.g., baffle reworking, bad electrical contact of various parts, worn quartz rings, etc.). This plasma leakage degrades performance and sometimes results in failures because of problems such as vertical leakage and functional yield degradation. The invention described below addresses these issues.

SUMMARY OF INVENTION

Disclosed is a method and system for detecting abnormal plasma discharge in a chamber that is useful in, for example, detecting plasma leakage in a reactive ion etching (RIE) chamber. The system includes electrical contacts connected to the chamber that provide an input signal to the chamber. This input signal can be generated by a radio frequency (RF) generator that is connected to the electrical contacts. A variable power controller connected to the RF generator gradually increases (ramps) the power of the input signal being supplied to the chamber.

An impedance monitor that is connected to the electrical contacts monitors the impedance seen on the electrical contacts to determine the voltage of the chamber. The invention monitors the impedance of the chamber through the electrical contacts. An abrupt change in the impedance indicates an abnormal plasma discharge in the chamber. More specifically, an abrupt drop in peak-to-peak voltage of the chamber indicates plasma leakage in the chamber.

In other words, the invention provides an input signal to the chamber using electrical contacts and gradually increases the power of the input signal. In one embodiment, the input signal comprises a ramped signal such as a step ramped signal or a smooth ramped signal. The invention monitors the impedance of the electrical contacts to determine the voltage of the chamber and an abrupt drop (e.g., a drop of greater than 5%) in peak-to-peak voltage of the chamber indicates plasma leakage in the chamber. This plasma leakage comprises formation of a region of secondary plasma in a location different from the intended primary plasma formation location (e.g., the wafer).

The invention includes a recording device to record the power at which the abrupt drop occurred. The invention also correlates the power level at which the abrupt drop in peak-to-peak voltage occurred with a specific type of chamber defect. In other words, some defects will consistently cause the onset of plasma leakage to occur at a specific power level. Therefore, the invention maintains a history of the power level associated with the onset of plasma leakage for each type of defect and prepares a correlation between power level and defect type. When an abrupt drop in peak-to-peak voltage is observed, the power level at which the voltage drop occurred can be quickly correlated to a probable defect. This allows the chamber to be periodically tested and defects diagnosed more quickly.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF DRAWINGS

The invention will be better understood from the following detailed description with reference to the drawings, in which.

DETAILED DESCRIPTION

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

As mentioned above, when plasma leakage occurs in an etching chamber, this results in power loss in the primary plasma location within the chamber, which degrades the etching process. The present inventors have developed a technique and system to determine when plasma leakage occurs. More specifically, the invention variably increases (ramps) the RF power applied to the reactor chamber and measures the impedance of this input signal as it is ramped. If the impedance drops abruptly, this indicates that plasma leakage has onset.

Figure 1:
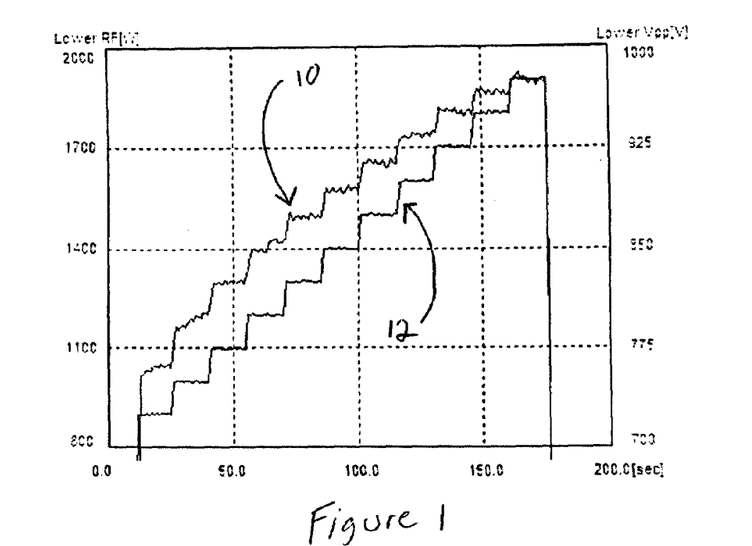
FIG. 1 is a graph showing the relationship between power of an input signal and peak-to-peak voltage within a processing chamber.
Figure 2:
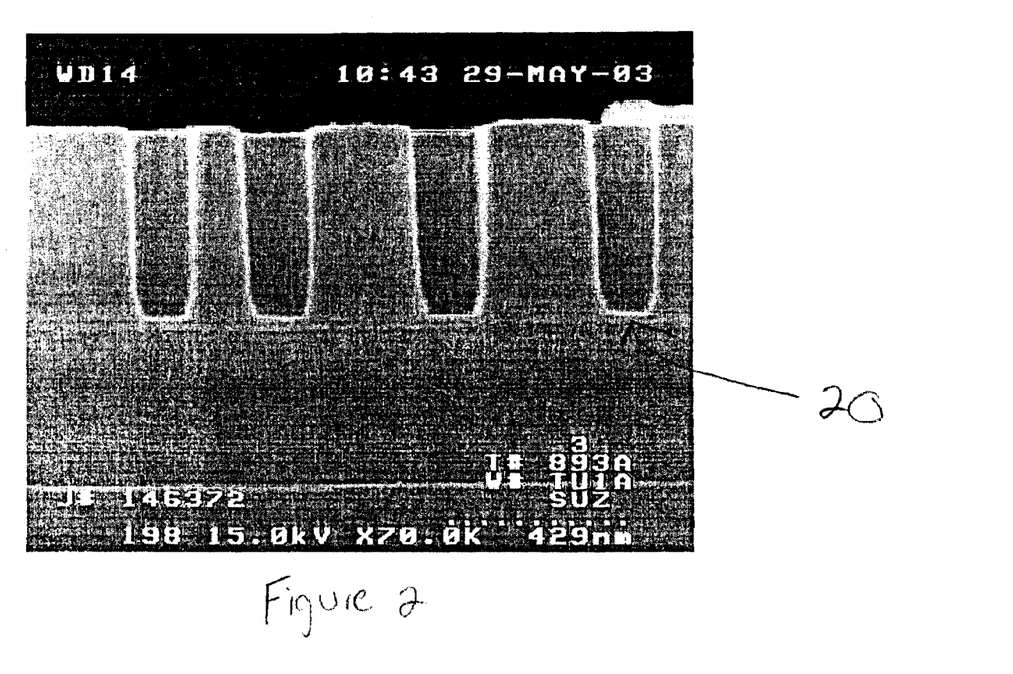
FIG. 2 is a schematic diagram illustrating proper reactive ion etched trenches.
Figure 3:
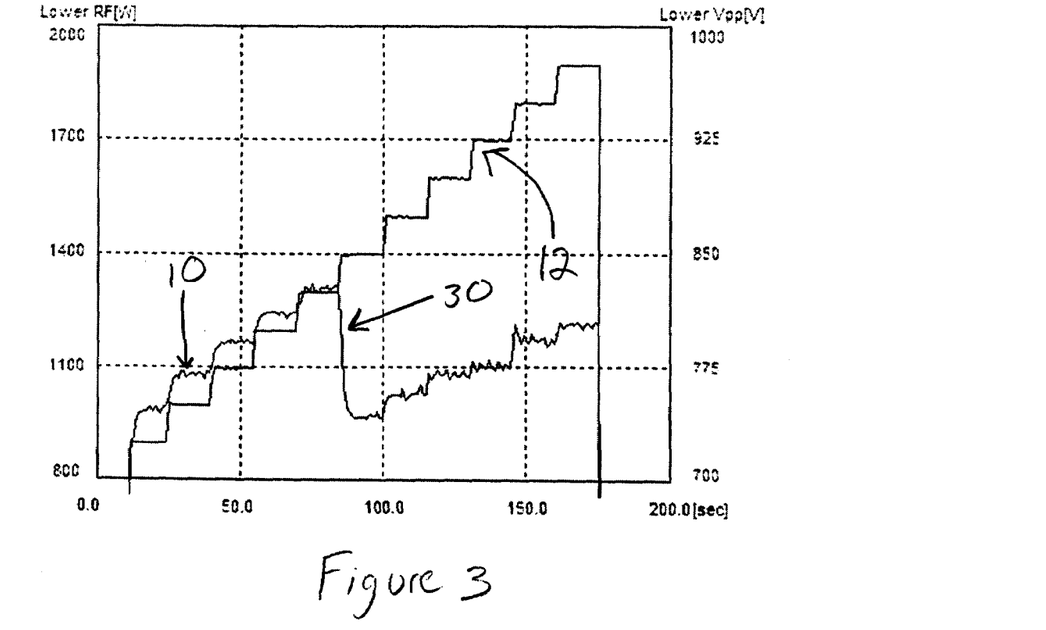
FIG. 3 is a graph showing the relationship between power of an input signal and peak-to-peak voltage within a processing chamber.
Figure 4:
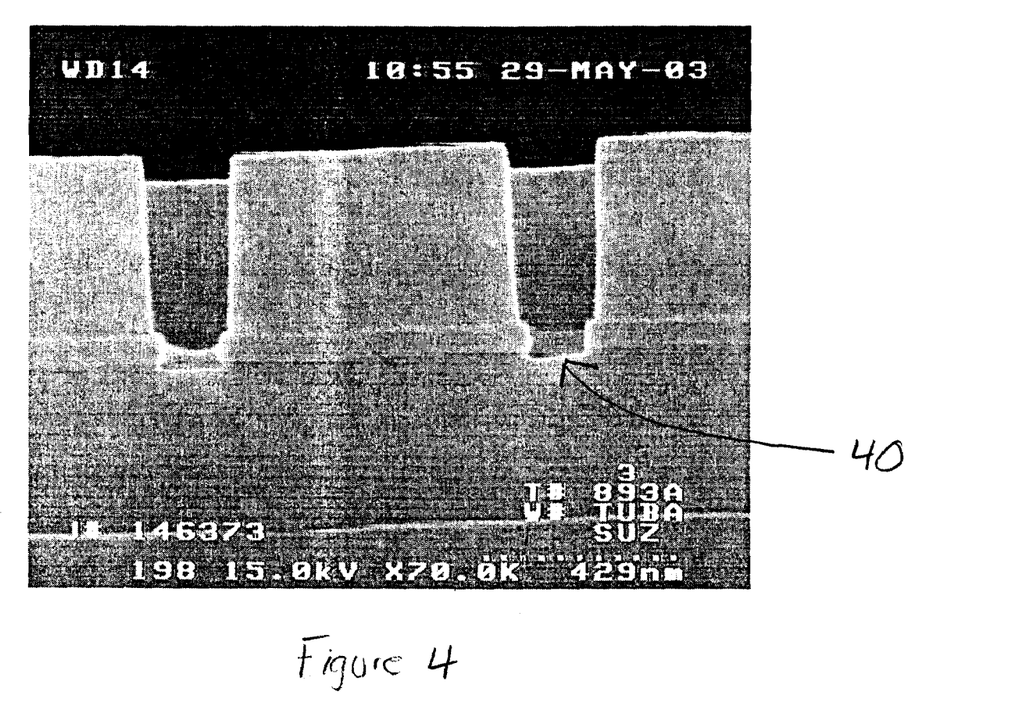
FIG. 4 is a schematic diagram illustrating improper reactive ion etched trenches.

FIGS. 1–4 illustrate this process. More specifically, FIG. 1 is a graph showing the relationship between the power of the input signal 10 and the associated impedance 12 seen on the input signal line 12. In FIG. 1, there is no abrupt drop in impedance; however, in FIG. 3, an abrupt drop in impedance 30 occurs at approximately 1400 W. Therefore, FIG. 3 illustrates the onset of plasma leakage at approximately 1400 W. The trenches 20 are properly formed (as shown in FIG. 2) when there is not plasma leakage as indicated by the graph in FIG. 1. However, trenches 40 are improperly formed (as shown in FIG. 4) when there is plasma leakage as indicated by the graph in FIG. 3. For example, FIG. 4 illustrates improperly formed lower portions of trenches 40 because of the plasma leakage.

Figure 5:
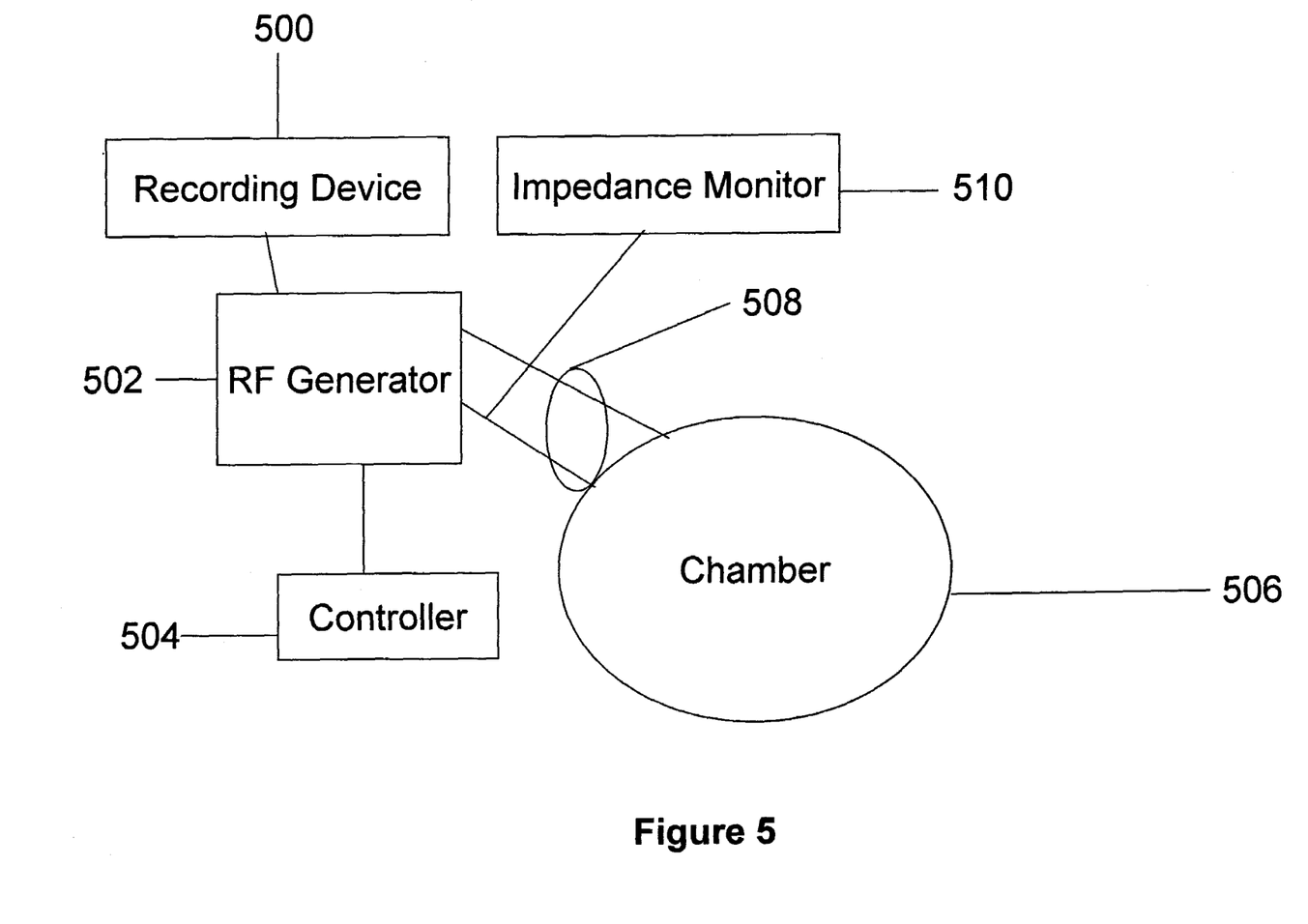
FIG. 5 is a system diagram of an embodiment of the invention.

Thus, as shown above, the invention observes when the impedance drops as the power signal is ramped in order to determine when plasma leakage onsets. While many different system embodiments could be utilized to perform such processing, one illustrative system embodiment is shown in FIG. 5. It is important to note that the system shown in FIG. 5 is only an example, and many other systems could be utilized with the invention. Therefore, the invention is not limited to the structure shown in FIG. 5, but instead is applicable to any such system.

As shown in FIG. 5, the invention provides a system for detecting abnormal plasma discharge in a chamber that is useful in, for example, detecting plasma leakage in a reactive ion etching (RIE) chamber. The system includes electrical contacts 508 connected to the chamber 506 that provide an input signal to the chamber 506. This input signal can be generated by a radio frequency (RF) generator 502 that is connected to the electrical contacts 508. A variable power controller 504 connected to the RF generator 502 gradually increases (ramps) the power of the input signal being supplied to the chamber 506.

An impedance monitor 510 that is connected to the electrical contacts 508 monitors the impedance seen on the electrical contacts 508 to determine the voltage of the chamber 506. Thus, the invention monitors the voltage of the chamber 506 through the impedance seen by the RF generator 502 by the electrical contacts 508. An abrupt change in the impedance indicates an abnormal plasma discharge in the chamber 506. More specifically, an abrupt drop in peak-to-peak voltage of the chamber 506 indicates plasma leakage in the chamber 506.

In other words, the invention provides an input signal to the chamber 506 using electrical contacts 508 and gradually increases the power of the input signal. In one embodiment, the input signal comprises a ramped signal such as a step ramped signal or a smooth ramped signal. The invention monitors the impedance seen on the electrical contacts 508 by the RF generator 502 to determine the voltage of the chamber 506 and an abrupt drop (e.g., a drop of greater than 5%) in peak-to-peak voltage of the chamber 506 indicates plasma leakage in the chamber 506. This plasma leakage comprises formation of a region of secondary plasma in a location different from the intended primary plasma formation location (e.g., the wafer).

The invention includes a recording device 500 to record the power at which the abrupt drop occurred. The invention also correlates the power level at which the abrupt drop in peak-to-peak voltage occurred with a specific type of chamber defect. In other words, some defects will consistently cause the onset of plasma leakage to occur at a specific power level. Therefore, the invention maintains a history of the power level associated with the onset of plasma leakage for each type of chamber defect in the recording device 500 and prepares a correlation between power level and chamber 506 defect type. Therefore, when an abrupt drop in peak-to-peak voltage is observed, the power level at which the voltage drop occurred can be quickly correlated to a probable chamber 506 defect. This allows the chamber 506 to be periodically tested and defects diagnosed more quickly.

Figure 6:
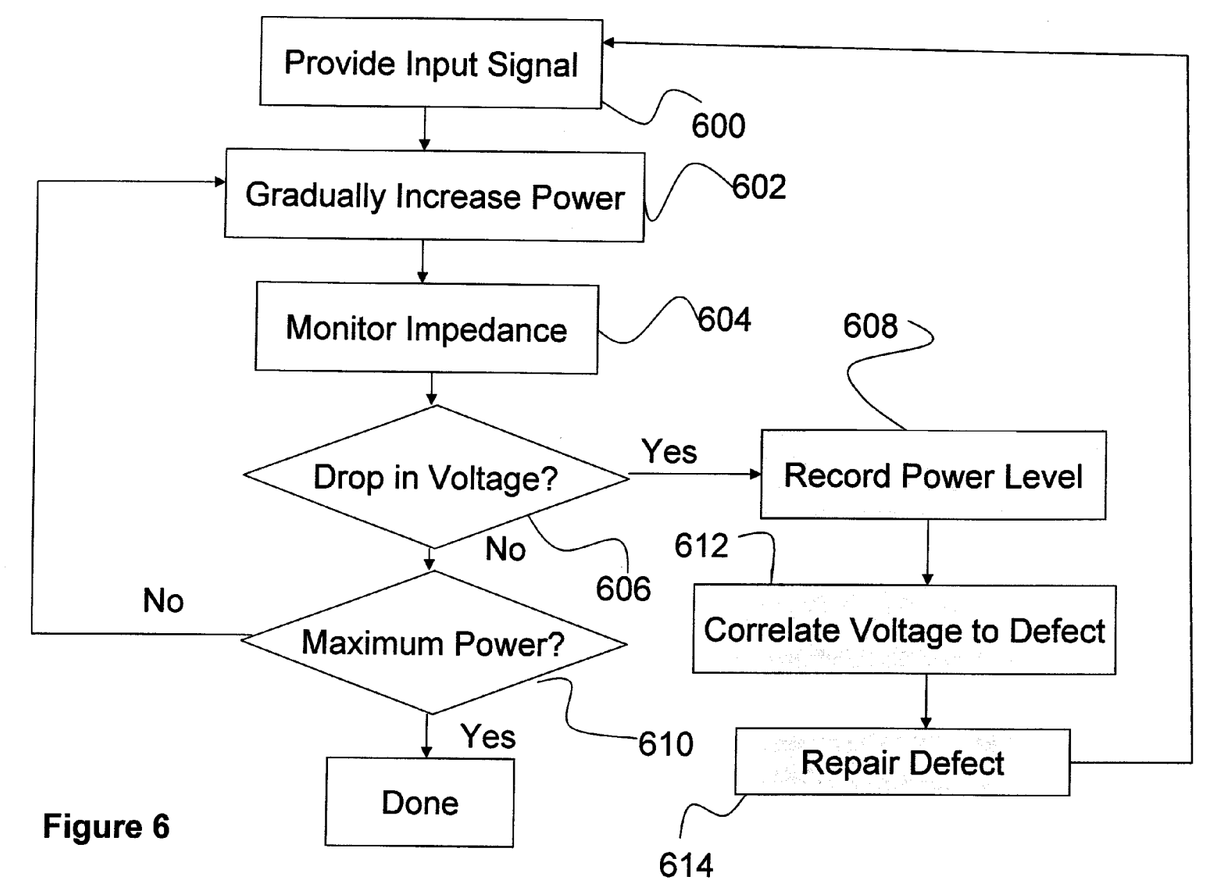
FIG. 6 is a flow diagram illustrating a preferred method of the invention.

As shown in flowchart form in FIG. 6, the invention provides a method of detecting plasma leakage in a reactive ion etching (RIE) chamber that begins by providing an input signal to the chamber using electrical contacts 600. Next, the invention gradually increases (smooth ramp or step ramp) the power of the input signal 602. In item 604, the invention monitors the impedance of the electrical contacts to determine the voltage of the chamber. If, during the monitoring process, there is an abrupt drop in peak-to-peak voltage of the chamber, this indicates plasma leakage in the chamber and processing proceeds to item 608 as indicated by decision box 606. In item 608, the invention records the power at which the abrupt drop occurred. The invention can correlate the power level at which the abrupt drop in peak-to-peak voltage occurred with a specific type of chamber defect, as shown in item 612. Then, in item 614, the defect is repaired and processing returns to item 600 to determine if any other defects are present. Processing continues to monitor the impedance until the power is increased to a maximum point as indicated by the processing return arrow from item 610 to item 602. If item 610 determines that the power has been increased to the maximum, processing is complete. Therefore, when an abrupt drop in peak-to-peak voltage is observed, the power level at which the voltage drop occurred can be quickly correlated to a probable chamber defect. This allows the chamber to be periodically tested and defects diagnosed more quickly.

While the invention has been described in terms of preferred embodiments, those skilled in the art will recognize that the invention can be practiced with modification within the spirit and scope of the appended claims.

The invention claimed is:

1. A method of detecting abnormal plasma discharge in a chamber, said method comprising:
   providing an input signal to said chamber;
   monitoring impedance of said chamber; and
   detecting whether an abnormal plasma discharge exists in said chamber by detecting an abrupt change in said impedance,
   wherein said abnormal plasma discharge comprises plasma leakage, and
   wherein said plasma leakage comprises formation of a region of secondary plasma in a location different from a primary plasma formation location.

2. The method in claim 1, wherein said input signal comprises a ramped signal.

3. The method in claim 1, wherein said ramped signal includes one of a step ramped signal and a smooth ramped signal.

4. The method in claim 1, wherein said input signal comprises a radio frequency (RF) signal.

5. The method in claim 1, wherein said impedance indicates the voltage of the chamber.

6. The method in claim 1, wherein said abrupt change in said impedance comprises an abrupt drop in peak-to-peak voltage of said chamber.

7. The method in claim 1, wherein said abrupt change comprises a drop in peak-to-peak voltage of greater than 5%.

8. The method in claim 1, wherein said process of providing said input signal uses electrical contacts connected to said chamber and said process of monitoring said impedance measures impedance of said electrical contacts.

9. A method of detecting plasma leakage in a reactive ion etching (RIE) chamber, said method comprising:
   providing an input signal to said chamber using electrical contacts;
   gradually increasing the power of said input signal;

monitoring impedance of said electrical contacts to determine the voltage of said chamber; and detecting whether plasma leakage exists in said chamber by detecting an abrupt drop in peak-to-peak voltage of said chamber, wherein said plasma leakage comprises formation of a region of secondary plasma in a location different from a primary plasma formation location.

10. The method in claim 9, further comprising recording the power at which said abrupt drop occurred.

11. The method in claim 9, wherein said process of gradually increasing the power of said input signal comprises supplying one of a step ramped signal and a smooth ramped signal.

12. The method in claim 9, wherein said input signal comprises a radio frequency (RF) signal.

13. The method in claim 9, wherein said abrupt drop comprises a drop in said peak-to-peak voltage of greater than 5%.

14. The method in claim 9, further comprising:

maintaining a history of power levels associated with an onset of plasma leakage for each type of defect;

measuring a power level at which said abrupt drop in peak-to-peak voltage occurred; and correlating said power level with a specific type of chamber defect maintained in said history.

* * * * *

UNITED STATES PATENT AND TRADEMARK OFFICE
CERTIFICATE OF CORRECTION

| | | |
|---|---|---|
| PATENT NO. | : 7,115,210 B2 | Page 1 of 6 |
| APPLICATION NO. | : 10/708009 | |
| DATED | : October 3, 2006 | |
| INVENTOR(S) | : Calderoni et al. | |

It is certified that error appears in the above-identified patent and that said Letters Patent is hereby corrected as shown below:

Delete Title page illustrating figure, and substitute therefor, new Title page illustrating figure. (attached)

Delete drawing figures 1-4, and substitute therefor drawing figures 1-4, as shown on the attached sheets.

Signed and Sealed this

Sixteenth Day of January, 2007

JON W. DUDAS
*Director of the United States Patent and Trademark Office*

(12) United States Patent
Calderoni et al.

(10) Patent No.: US 7,115,210 B2
(45) Date of Patent: Oct. 3, 2006

(54) MEASUREMENT TO DETERMINE PLASMA LEAKAGE (75) Inventors: Robert A. Calderoni, Fairfield, VT (US); June Cline, South Burlington, VT (US); Kellie L. Dutra, Essex Junction, VT (US); Ronald G. Meunier, Essex Junction, VT (US); Joseph P. Walko, Jericho, VT (US); Justin Wai-chow Wong, South Burlington, VT (US)

(73) Assignee: International Business Machines Corporation, Armonk, NY (US)

(*) Notice: Subject to any disclaimer, the term of this patent is extended or adjusted under 35 U.S.C. 154(b) by 132 days.

(21) Appl. No.: 10/708,009

(22) Filed: Feb. 2, 2004

(65) Prior Publication Data
US 2005/0167396 A1 Aug. 4, 2005

(51) Int. Cl.
H01L 21/302 (2006.01)

(52) U.S. Cl. .............. 216/59; 216/61; 118/712; 275/E21.528; 438/14; 438/16; 455/118

(58) Field of Classification Search .............. 216/59.
See application file for complete search history.

(56) References Cited

U.S. PATENT DOCUMENTS

| 5,326,975 A | 7/1994 | Barna |
| 5,467,013 A | 11/1995 | Williams et al. |
| 5,576,629 A | 11/1996 | Turner et al. |
| 5,810,963 A | 9/1998 | Tomioka |
| 5,925,212 A * | 7/1999 | Rice et al. ............ 156/345.27 |
| 5,971,591 A | 10/1999 | Vonna et al. |
| 6,228,278 B1 * | 5/2001 | Winniczek et al. ......... 216/61 |
| 6,599,759 B1 | 7/2003 | Yang et al. |
| 6,661,250 B1 * | 12/2003 | Kim et al. ............ 326/30 |
| 6,756,790 B1 * | 6/2004 | Yakabe et al. ............ 324/649 |
| 2002/0039887 A1 * | 4/2002 | Delabbaye et al. ......... 455/42 |
| 2002/0171454 A1 * | 11/2002 | Yakabe et al. ............ 327/77 |
| 2003/0085662 A1 | 5/2003 | Kwon et al. |
| 2003/0121609 A1 * | 7/2003 | Ohmi et al. ............ 156/345.47 |
| 2003/0227283 A1 * | 12/2003 | Cox et al. ............ 324/71.1 |
| 2004/0055868 A1 * | 3/2004 | O'Leary et al. ......... 204/157.15 |
| 2004/0116080 A1 * | 6/2004 | Chen et al. ............ 455/115.1 |
| 2004/0129218 A1 * | 7/2004 | Takahashi et al. ......... 118/715 |
| 2004/0135590 A1 * | 7/2004 | Quon ............ 324/713 |
| 2004/0149384 A1 * | 8/2004 | Kanno et al. ............ 156/345.24 |
| 2005/0145334 A1 * | 7/2005 | Parsons ............ 156/345.24 |

FOREIGN PATENT DOCUMENTS

JP 2003173973 * 6/2003

OTHER PUBLICATIONS

Hanson et al, of Advanced Energy: Optimization Chemical Vapor Deposition Processing through RF Metrology, 1999.*

(Continued)

Primary Examiner—Nadine Norton
Assistant Examiner—Patricia George
(74) Attorney, Agent, or Firm—Gibb I.P. Law Firm, LLC; Anthony Canale (57) ABSTRACT

Disclosed is a method and system for detecting abnormal plasma discharge that is useful in, for example, detecting plasma leakage in a reactive ion etching (RIE) chamber. The system includes electrical contacts connected to the chamber that provide an input signal to the chamber. This input signal can be generated by a radio frequency (RF) generator that is connected to the electrical contacts. A variable power controller connected to the RF generator gradually increases (ramps) the power of the input signal being supplied to the chamber.

14 Claims, 4 Drawing Sheets